March 3, 1964 S. N. PORTER 3,123,716
PULSE TRANSLATING APPARATUS
Filed March 14, 1958
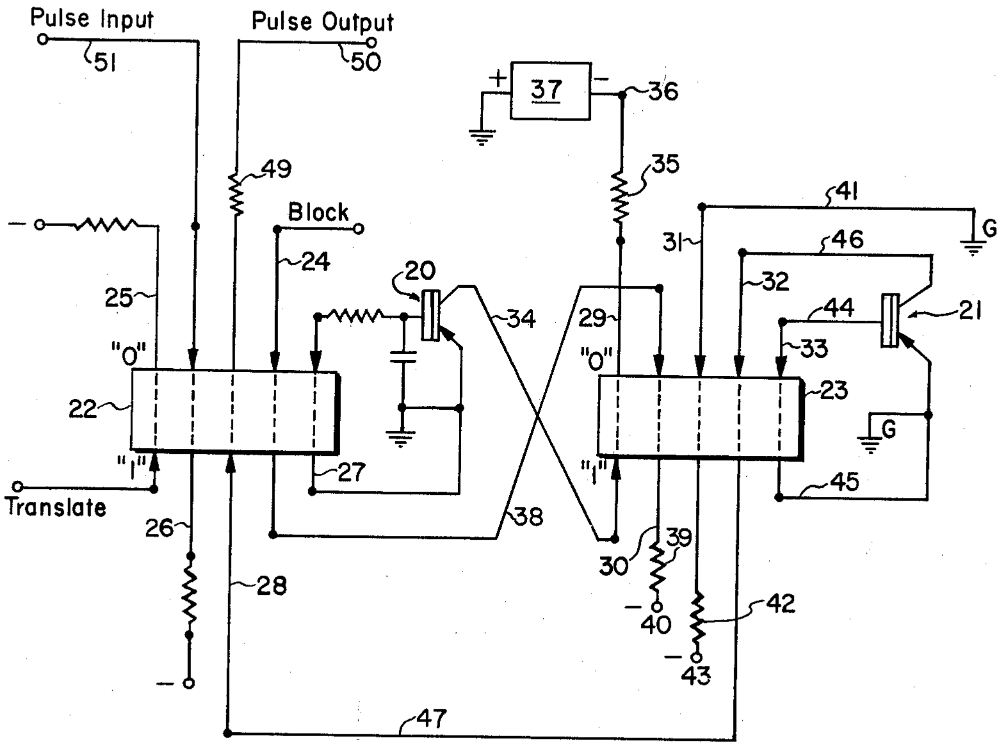
INVENTOR:
Sigmund N. Porter
By Louis A. Kline
John J. Matlago
His Attorneys United States Patent Office 3,123,716

Patented Mar. 3, 1964

3,123,716

PULSE TRANSLATING APPARATUS

Sigmund N. Porter, Beverly Hills, Calif., assignor to The National Cash Register Company, Dayton, Ohio, a corporation of Maryland Filed Mar. 14, 1958, Ser. No. 721,505
12 Claims. (Cl. 307—88)

This invention relates to switch means, and more particularly to solid state electronic switch means adapted to selectively translate or exclude groups of one or more pulses from a continuing series of time-spaced electric pulses. Still more specifically the means of the present invention relates to controllable apparatus for selectively producing no output, or alternatively, an amplified pulse output, in response to each input pulse supplied to the means, using solid state devices as bistable elements and transistor means solely as amplifying means.

In certain operations, as for example, certain computer operations, it is desirable to be able to provide at an output line either absence of pulses or a train of one or more amplified pulses, in response to an input comprising a continuing succession of electric pulses, the output being under control of control pulses of first and second types. The prior art presents a variety of pulse gates, switches and like means for controllably switching electric pulses. These apparatuses are attended, however, with one or more of disadvantageous features such as, for examples, pulse attenuation, inability to continue pulse gating functions after expiration of a control signal (that is, requiring a continuing control potential during the entire period during which pulses are either to be passed or to be excluded), excessive number of components, volatile memory, excessive power consumption, and large space requirements.

The present invention provides a pulse translator which includes only small "solid state" elements of very low power consumption, and which switches or translates pulse trains of any desired length without application of a continuing control potential. The translating or switching action is changed from open to closed status, or vice versa, in response to but a single short-duration electric pulse in each instance, the apparatus having self-contained memory means effective to maintain the translation operative or inoperative for any desired duration. The memory factor responds to a control pulse and thereafter acts to maintain the pulse translating channel open, or closed, until a succeeding control pulse of different effect is provided. The switching action is thus somewhat similar to the action of a latching relay which sets up and remains conductive until released (reset). However, apparatus according to the present invention involves no moving or bulky parts, is much faster in operation than a relay, and in addition provides at the output line a pulse of amplified magnitude relative to the input pulse.

As may be evident, it is a prime object of the invention to provide an improved electric pulse translating apparatus. A more specific object is to provide a solid-state pulse translating apparatus providing a switching action responsive to electric control pulses. An additional object is to provide a solid-state latching-type pulse switching and translating system capable of being operated from any one to the other of first and second pulse switching and translating conditions incident to application of a respective one of first and second types of control pulses and capable while in the first condition of producing at an output line a pulse of amplified form corresponding to each electric input pulse supplied to an input line. Other features, objects, and advantages of the invention will hereinafter become or be made apparent in connection with the appended claims and the following description in which reference is made to the drawing illustrating a preferred physical embodiment of the invention, and in which drawing:

FIG. 1 is a schematic circuit diagram of circuitry employed in the preferred exemplary physical form of the invention, with bistable devices illustrated symbolically.

The exemplary apparatus diagrammatically depicted in the drawing includes first and second transistors 20 and 21, respectively, and first and second bistable magnetic cores 22 and 23, respectively. The cores are symbolically represented by respective rectangles, for a reason hereinafter made apparent. Each core is provided with a respective set of windings of first and second types, each of the windings being inductively linked to the respective core for inductive coaction therewith. The windings, while for convenience herein classified into two types, may be substantially similar or alike. The division into two types is to facilitate differentiation between windings carrying significant currents in different effective "directions" as is hereinafter more fully explained.

The first and second bistable magnetic cores, which may be similar or alike and which preferably are of toroidal configuration and of a material imparting a substantially "rectangular" current-magnetization characteristic, are adapted to be coerced or "driven" from either to the other of opposite-polarity remanent magnetization states by suitable currents or pulses coursing through respective individual windings. The opposite-polarity remanent magnetization states are for conciseness and convenience herein symbolically designated and represented by "0" and "1," respectively; and it is immaterial which polarity bears a particular one of the symbolic designations as long as that which is arbitrarily selected is uniformly adhered to in the following description of additional details and features of the exemplary apparatus.

Significant electric current or pulse flow directions in the several individual windings are indicated by arrow points applied to the windings at the rectangles representing the cores, the representations being such that a pulse coursing through the winding in the direction of the respective arrow point is such as to tend to coerce or change the magnetic state of the core to that one of the two states indicated by that one of the symbols "0" and "1" shown at the side of a rectangle opposite the arrow point. Windings having upwardly directed arrow points will be considered to be of the first type, and those bearing downwardly directed arrow points will be considered to be of the second type; and for convenience the terms "upwardly" and "downwardly" may herein be employed to indicate the coursing of a current or pulse through a winding in such a manner as to coerce or drive the core linked to the winding to "0" and to "1," respectively. For illustrative examples, a pulse of a first type may be considered to course "upwardly" through a winding 25 linked to core 22 and thereby tend to coerce that core from "1" to "0," and a pulse may be directed "downwardly" through a winding 24 and tend to coerce or drive the core from "0" to "1." It is to be noted that if a core is already existent in that remanent state toward which a pulse or current would otherwise tend to coerce the core, no significant action occurs, since the core is already substantially in a condition of magnetic saturation. However, if the core is susceptible of being driven to the mentioned particular state, an otherwise unopposed pulse or current may turn the core over to the opposite state.

While bistable magnetic cores of toroidal form are preferred, other types of cores may be employed; and the windings may be of partial-turn, multiple-turn, or other type, or such as to provide satisfactory electromagnetic inductive linkage with the respective core.

In accord with the laws of electromagnetic phenomena, when a bistable magnetic core is coerced from one remanent state to the other, a potential is induced in any winding inductively linked to the core. The polarity of the induced potential will depend upon the "direction" of the change in state, from "0" to "1," or vice versa, as is well understood by those skilled in the art. Thus when core 22 commences to turn over from "0" to "1" incident to a downwardly directed pulse coursing through, for example, winding 26, there is induced a potential in a sense winding 27. Transistor 20 has its base and emitter terminals connected to winding 27 as indicated; and the arrangement is such that the polarity of the induced potential resulting from the downwardly directed pulse in winding 26 is such as to bias transistor 20 into conductive status. As previously indicated, if core 22 were in "1," the pulse in winding 26 would not produce a significant change in the core, and a transistor-triggering potential would not be induced in winding 27 and transistor 20 would not conduct. Also it is evident that the transistor will not be triggered into conduction by an "upwardly" coursing pulse, irrespective of the state of the core, because any potential thereby induced in winding 27 would be of polarity opposite that required to bias the transistor into conductive condition.

Core 22 is equipped with the previously noted windings, and with an output winding 28 which normally carries only "upwardly" directed pulses. Core 23 is provided with windings 29, 30, 31, 32, and 33. Winding 29 is connected through a conductor 34 to receive the collector current from transistor 20, the current coursing "upwardly" through winding 29 and a current-limiting resistor 35 to the negative terminal 36 of a power source 37 which is connected to ground as indicated. Winding 30 is connected through conductor 38 to receive a downwardly coursing control current from winding 24 of core 22, the current also coursing downwardly through a resistor 39 to a negative terminal 40 which may be connected to a power supply which may be source 37. Winding 31 is connected to carry continuously a core-biasing current from ground (G) through conductor 41, downwardly through winding 31 and a resistor 42 to a negative terminal 43 of a power supply which may be source 37.

Transistor 21 is connected in grounded-emitter mode, and is connected as indicated by conductors 44 and 45 to winding 33 whereby coercion of core 23 from "0" toward "1" by a downwardly directed current in winding 31, for example, will induce a transistor-triggering potential in sense winding 33 and cause the transistor to conduct. The steady bias current through winding 31 causes core 23 to normally repose at "1" or return automatically thereto after having been driven to "0" by a pulse through winding 29. Thus when an upwardly coursing pulse passes through winding 29 and drives core 23 to "0" by overcoming the effect of bias current in winding 31, a voltage of incorrect polarity to trigger transistor 21 is induced in winding 33; but upon expiration of that driving pulse the bias current commences coercion or return of core 23 to "1," and the potential then induced in winding 33 triggers transistor 21 into conduction. When this action occurs, the output pulse flowing from the transistor collector through lead 46 flows through winding 32 (aiding the bias current in turning over core 23) and flows through a conductor 47, winding 28 of core 22, a limiting resistor 49 and into the output circuit 50. It is not essential that the output pulse from transistor 21 be passed through a winding on core 23 to aid in coercing the core to "1," but it is convenient to do so, for example, to reduce the magnitude of steady bias current required.

With the preceding detailed description in mind, operation of the translator is easily understood. To render the translator effective to translate pulses as supplied on pulse input line 51, core 22 is driven to "0" by an "upwardly" directed translate control pulse through winding 25. The next succeeding pulse apparent on line 51 reversely coerces core 22 to "1," triggering transistor 20 into conduction. The amplified output pulse from the collector of transistor 20 passing through conductor 34 and winding 29, drives core 23 to "0" against the effort of the bias current; and when the pulse subsides and the bias current starts to coerce core 23 to "1," transistor 21 conducts. The output pulse from transistor 21 aids in returning core 23 to "1," flows through winding 28 and drives core 22 again to "0" and forms on output line 50 an output pulse representing an amplified translation of the input pulse from line 51. Thereafter, the next pulse on line 51 institutes the same cycle of operations; and the cyclical translation of pulses continues until such action is inhibited.

With pulse translation proceeding as previously described, translation is controllably terminated by pulsing block-control winding 24 with a "downwardly" directed pulse which returns core 22 to "1," triggers transistor 20 into conduction, and by coursing "downwardly" through winding 30 concurrently inhibits the output pulse from transistor 20 from driving core 23 to "0." Thus the output of transistor 20 cannot trigger transistor 21 into conduction, and an output pulse from the latter is not available for driving core 22 to "0." Thereafter, incoming pulses on line 51 have no effect on core 22 (now in "1") and translation of pulses is effectively prohibited until a control pulse through winding 25 drives core 22 to "0" and again sets the apparatus into operation. It is evident that application of a "translate" control pulse through winding 25 renders the apparatus effective to translate pulses incoming on line 51, and that in response to each input pulse the apparatus will then produce an output pulse of amplified proportions on output line 50. Further, translation of pulses may thereafter be instantly inhibited or terminated by application of a block control pulse on line 24. Also evident is the fact that no output pulse is produced in response to application of an inhibit or block pulse to line 24, even if it be contemporaneous with an input pulse on line 51, since the control pulse blanks out the capability of the collector pulse in winding 29 to turn over core 23.

While p-n-p type transistors have been used in the illustrative embodiment of apparatus according to the invention, it is evident that other types may be used, with suitable interchange of terminal connections. Preferably transistors having desirably high amplification characteristics are used, whereby attenuation in the pulse translation is avoided. Since only solid-state electronc devices are employed, very low power losses are involved, with no moving or heated elements, and the entire apparatus may be assembled in a very small volumetric space. Changes and modifications in the apparatus will in the light of the present disclosure become evident to those skilled in the art and accordingly it is not desired to limit the invention to the exact details of the preferred exemplary embodiment.

What is claimed is:

1. Pulse translation means comprising: first and second magnetic cores each susceptible of coercion from either to the other of opposite magnetic states representable by "0" and "1" respectively, and means for normally biasing said second core to "1"; first means including input means for pulses to be translated) for reversing the state of said first core from an initial state to the opposite state incident to reception of a translatable input pulse; second means responsive to the reversing of said first core from said initial state to the opposite state to temporarily coerce said second core to "0" against the normal bias on that core; and means responsive to return of said second core to "1" by said bias to produce a pulse to automatically return said first core to its initial state and provide an output pulse representing a translation of said translatable input pulse, said last-mentioned means being constructed and arranged so that the pulse produced thereby in response to the return of said second core to "1" by said bias is sufficient by itself to automatically return said first core to its initial state.

2. Pulse translation means according to claim 1, including means coupled to said first and second cores to inhibit translation of an input pulse.

3. Pulse translation means according to claim 1, wherein said second means includes a transistor, a sense winding connected to said first core so as to render the transistor conductive incident to reversal of state of the core from said initial state to the opposite state, and a winding coupled to said second core and said transistor so as to temporarily coerce said second core as stated in claim 1 when said transistor conducts.

4. Pulse translation means comprising: first and second magnetic cores each susceptible of coercion from either to the other of first and second opposite magnetic states representable by "0" and "1," respectively; means normally biasing the second core to "1"; means for initially coercing said first core to "0"; first means including input means for pulses to be translated, for coercing said first core from "0" to "1" in response to an input pulse; second means including first transistor means responsive to coercion of said first core from "0" to "1" to temporarily coerce said second core from "1" to "0" against the normal bias; and means coupling said first and second cores and responsive to return of said second core from "0" to "1" by the normal bias, to produce an output pulse representative of said input pulse and to reset said first core to "0" preparatory to translation of a succeeding input pulse, said last-mentioned means being constructed and arranged so that the pulse produced thereby in response to the return of said second core from "0" and "1" by the normal bias is sufficient by itself to automatically return said first core to its initial state.

5. Pulse translation means according to claim 4, comprising means coupled to said second core to inhibit temporary coercion of said second core from "1" to "0," while said first core is being coerced from "0" to "1" by an inhibiting pulse in order to inhibit translation of one or more input pulses following said inhibiting pulse.

6. Pulse translation means comprising: a bistable magnetic core provided with windings inductively linked thereto whereby the core may be coerced from either to the other of opposite remanent states representable by "0" and "1" respectively; a transistor means, connected to be triggered into conduction incident to coercion of said core from "0" to "1"; first means cooperating with one of said windings to initially coerce said core to "0"; second means cooperating with one of said windings and effective to reversely coerce said core from "0" to "1" in response to application of a translatable input pulse; and third means responsive to conduction of current by said first transistor means to produce an output pulse representing a translation of the said input pulse, and cooperating with one of said windings to cause said output pulse to coerce said core from "1" to "0" preparatory to reception of a second translatable input pulse, said third means being constructed and arranged so that the pulse produced thereby in response to conduction by said first transistor is sufficient by itself to automatically return said first core to its initial state.

7. Pulse translation means according to claim 6, including means to selectively inhibit production of an output pulse in response to conduction of current by said transistor means.

8. Pulse translation means according to claim 6, said third means comprising a second magnetic core means and a second transistor means triggered into conduction incident to reversal of state of said second core in response to conduction by said first transistor.

9. Pulse translation apparatus selectively controllable alternatively to inhibit translation of pulses when in a first condition and to produce an output pulse representing a translation of an input pulse when in a second condition, comprising: first and second bistable magnetic cores each susceptible of coercion from either to the other of opposite remanent magnetic states representable by "0" and "1" respectively; first means for normally biasing the second core to "1"; control means to initially coerce said first core from "1" to "0" to bring the apparatus to said second condition; second means including first and second transistor means and first and second groups of core windings on respective ones of said first and second cores, effective solely by interaction therebetween to (*a*) coerce said first core from "0" to "1" incident to reception of an input pulse, (*b*) induce conduction through said first transistor means and pass the conducted current through a winding linked to said second core to temporarily overcome the normal bias thereon, and coerce the core to "0," (*c*) cause conduction of an output pulse through said second transistor incident to return coercion of said second core to "1" by the normal bias, and (*d*) cause said output pulse to effect return coercion of said first core to "0" and exit as an output pulse representative of a translation of the input pulse; and second control means for inhibiting the translating actions of said second means and bringing the apparatus to said first condition.

10. Solid-state pulse translation means comprising: first and second bistable magnetic cores each capable of being coerced from either to the other of opposite remanent states representable by "0" and "1" respectively; first and second transistors; first and second sense windings inductively linked to respective ones of said cores and connected to respective ones of said first and second transistors in directions so as to cause the respective transistor to conduct incident to coercion of the respective core from "0" toward "1"; means normally biasing said second core to "1"; means to initially coerce said first core to "0"; means responsive to an input pulse to be translated, to coerce said first core to "1" to bias said first transistor to conduct; means connected to said first transistor for normally temporarily coercing said second core to "0" against the normal bias when said first transistor conducts; means including connections to said second transistor for concurrently coercing said first core to "0" and providing an output pulse representing a translation of said input pulse, incident to return coercion of said second core to "1" by said normal bias, the pulse produced by conduction of said second transistor in response to the return of said second core to "1" by the normal bias being sufficient by itself to automatically return said first core to "0"; and means for inhibiting translation of an input pulse, including means to concurrently coerce said first core to "1" and aid said normal bias to inhibit temporary coercion of said second core to "0" incident to conduction by said first transistor.

11. Solid-state pulse translation means comprising: first and second bistable magnetic cores each capable of being coerced from either to the other of opposite remanent states representable by "0" and "1" respectively; first and second transistors; first and second sense windings inductively linked to respective ones of said cores and connected to respective ones of said first and second transistors to bias the respective transistor to conduct incident to coercion of the respective core from "0" toward "1"; means normally biasing said second core to "1"; means to initially coerce said first core to "0"; means responsive to an input pulse to be translated, to return said first core to "1" to bias said first transistor to conduct; means connected to said first transistor for temporarily coercing said second core to "0" against the normal bias; means including connections to said second transistor and effective upon return of said second core to "1" by the normal bias, to produce a signal which by itself is sufficient to concurrently coerce said first core to "0" and provide an output pulse representing a translation of said input pulse; and means for inhibiting translation of an input pulse, including means to inhibit temporary coercion of said second core to "0" while said first core is coerced from "0" to "1" by an inhibiting pulse.

12. A solid state electric pulse translating apparatus adapted to selectively produce an output pulse representing a translation of a translatable input pulse and alternatively inhibit production of an output pulse, in response to application of a translate control pulse, and an inhibit control pulse, respectively, comprising: first and second bistable magnetic cores each susceptible of coercion to either from the other of first and second remanent magnetic states represented by "0" and "1," respectively; windings, each inductively linked with a respective one of said cores; first and second transistor means each connected with a respective one of said windings so as to be caused to conduct in response to coercion of the respective core from "0" to "1"; means cooperating with one of said windings to normally bias said second core to "1"; means responsive to a translate control pulse and cooperating with one of said windings to selectively initially coerce said first core to "0" preparatory to translation of a group of at least one translatable input pulse; a pulse input line connected to one of said windings for return coercion of said first core from "0" to "1" incident to application to the line of an input pulse; means including connections from said first transistor, cooperating with one of said windings to temporarily coerce said second core from "1" to "0" against the normal bias, incident to coercion of said first core from "0" to "1" by an input pulse; means cooperating with one of said windings to produce a pulse in response to the return of said second core from "0" to "1" by the normal bias, which pulse upon passing through one of the said windings linked to said first core is sufficient by itself to coerce said first core from "1" to "0"; and translation inhibiting means responsive to an inhibit control pulse, cooperating with first and second of said windings linked to respective ones of said first and second cores and effective to inhibit coercion of said second core from "1" to "0" incident to conduction through said first transistor.

References Cited in the file of this patent

UNITED STATES PATENTS

| | | |
|---|---|---|
| 2,591,406 | Carter et al. | Apr. 1, 1952 |
| 2,863,138 | Hemphill | Dec. 2, 1958 |
| 2,920,314 | Miehle | Jan. 5, 1960 |
| 2,923,923 | Raker | Feb. 2, 1960 |
| 2,968,796 | Lane et al. | Jan. 17, 1961 |